United States Patent
Oratti Kalandar et al.

(10) Patent No.: US 9,691,637 B2
(45) Date of Patent: Jun. 27, 2017

(54) METHOD FOR PACKAGING AN INTEGRATED CIRCUIT DEVICE WITH STRESS BUFFER

(71) Applicant: FREESCALE SEMICONDUCTOR, INC., Austin, TX (US)

(72) Inventors: Navas Khan Oratti Kalandar, Austin, TX (US); Nishant Lakhera, Austin, TX (US); Akhilesh K. Singh, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/877,467

(22) Filed: Oct. 7, 2015

(65) Prior Publication Data
US 2017/0103905 A1  Apr. 13, 2017

(51) Int. Cl.
  *H01L 21/56*  (2006.01)
  *H01L 21/78*  (2006.01)
(52) U.S. Cl.
  CPC ........... *H01L 21/563* (2013.01); *H01L 21/78* (2013.01)
(58) Field of Classification Search
  CPC ...... H01L 21/563; H01L 21/565; H01L 21/78
  See application file for complete search history.

(56) References Cited

U.S. PATENT DOCUMENTS

| | | | |
|---|---|---|---|
| 4,952,999 A | 8/1990 | Robinson et al. | |
| 5,049,976 A | 9/1991 | Demmin et al. | |
| 6,432,753 B1 | 8/2002 | Abesingha et al. | |
| 7,651,891 B1 | 1/2010 | Nguyen | |
| 7,750,443 B2 * | 7/2010 | Kadoi | H01L 23/3107 257/666 |
| 7,821,117 B2 | 10/2010 | Brown et al. | |
| 8,058,677 B2 | 11/2011 | Summerfelt et al. | |
| 9,202,770 B1 * | 12/2015 | Foong | H01L 23/3675 |
| 2006/0145325 A1 * | 7/2006 | Yang | H01L 27/14618 257/680 |
| 2010/0301708 A1 * | 12/2010 | Tsuda | H03H 9/059 310/344 |
| 2012/0161306 A1 | 6/2012 | Krimmer | |

FOREIGN PATENT DOCUMENTS

WO  9524737 A1  9/1995

* cited by examiner

*Primary Examiner* — Latanya N Crawford

(57) ABSTRACT

A method of fabricating a plurality of semiconductor devices includes attaching a plurality of integrated circuit (IC) die to a substrate including forming electric connections between contacts on the IC die and contacts on the substrate. After the IC die is attached to the substrate, a first encapsulating material is placed over stress-sensitive areas of the IC die. The first encapsulating material includes thirty percent or less of filler particles greater than a specified size. A second encapsulating material is placed over the first encapsulating material. The second encapsulating material includes sixty percent or more of filler particles.

20 Claims, 3 Drawing Sheets

METHOD FOR PACKAGING AN INTEGRATED CIRCUIT DEVICE WITH STRESS BUFFER

BACKGROUND

Field

This disclosure relates generally to integrated circuit device packaging, and more specifically, to packaging an integrated circuit device with stress buffer.

Related Art

Today, many integrated circuit devices are packaged in low cost packaging which generally includes a semiconductor die encapsulated in a plastic encapsulant. As integrated circuit devices become more and more sophisticated, some circuitry can be sensitive to thermo-mechanical stresses commonly associated with low cost packaging. For example, sensitive analog circuitry may require voltage tolerances such as +/−0.1 mV but package stress can cause the sensitive circuitry to exceed required voltage tolerance with performance such as +/−5 mV. One way to reduce stress effects on the sensitive circuitry is to add steps to the manufacturing process such as at wafer level, applying a patterned dielectric material directly above the sensitive circuitry while in wafer form before encapsulating the semiconductor die with an encapsulant. However, additional steps added to the manufacturing process can significantly impact the overall integrated circuit device complexity and cost. What is needed is a more cost effective approach to reduce stress in packaged integrated circuit devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present disclosure describes a low cost packaging method for integrated circuit devices which reduces stress on the surface of a semiconductor die. In one embodiment, the integrated circuit device packaging includes a first layer of encapsulant which buffers stress from a second layer of encapsulant. The first layer of encapsulant includes a low modulus material and is placed over the semiconductor die. The second layer of encapsulant includes a high modulus material and is placed over the first layer. Both the first layer and the second layer encapsulants can be placed simultaneously during the same manufacturing step.

Figure 1:
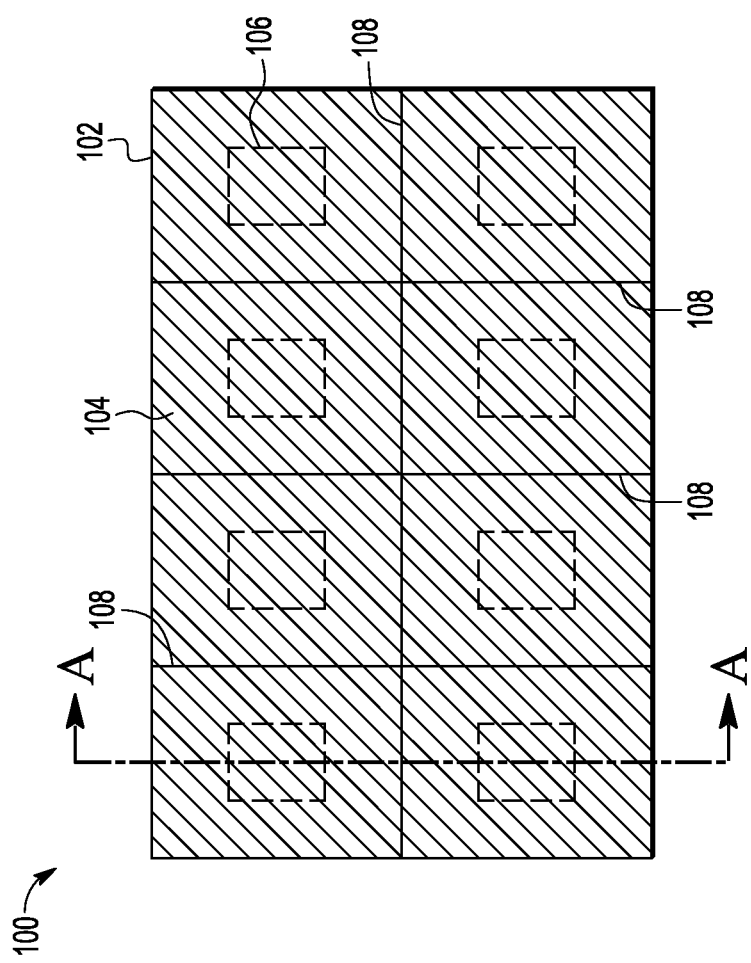
FIG. 1 shows a simplified plan view of an exemplary molded strip of integrated circuit devices according to an embodiment of the present disclosure.

FIG. 1 shows a simplified plan view of an exemplary molded strip 100 of packaged integrated circuit devices according to an embodiment of the present disclosure. Molded strip 100 includes a plurality of integrated circuit components such as semiconductor dies 106 mounted on a substrate 102 and encapsulated with a first blanket layer of encapsulant material (not shown) and a second blanket layer of encapsulant material 104 to form an array or matrix of integrated circuit devices. The molded strip shown includes two rows each having four integrated circuit devices all formed within encapsulant 104. Singulation lines 108 illustrate where the molded strip is cut to singulate each of the integrated circuit devices. A cross-sectional view is taken at section line A-A of the exemplary molded strip 100.

The substrate 102 may include a leadframe, organic or ceramic substrate, chip carrier, or the like. For example, a leadframe includes a flag having an area for attaching a semiconductor die, a plurality of tie bars to support the flag, and a plurality of leads surrounding the flag. The leadframe may be formed of any suitable electrically conductive material that is easy to shape, such as aluminum, copper, nickel, or iron, or alloys including one or more of these materials, such as alloy-42 for example. The conductive metal may be bare, partially plated, or plated with another metal or an alloy such as iron/nickel alloy, silver, gold, or the like. In some embodiments, the flag may be formed of a material different from the plurality of leads surrounding the flag. In some embodiments, the flag may be plated with a material different from the plurality of leads. In some embodiments, the flag may be bare and the plurality of leads may be plated, or the flag may be plated and the plurality of leads may be bare. The leadframe may be a stamped leadframe or an etched leadframe.

Plurality of semiconductor dies 106 are attached to the die attach areas of substrate 102 using any suitable die attach material. Semiconductor dies 106 may be formed of any semiconductive material, such as a silicon, germanium, gallium arsenide, and the like. Semiconductor dies 106 may include any or combinations of digital circuits, analog circuits, memory, processor, MEMS, sensors, and the like.

Encapsulant layer 104 depicts a blanket layer of material encapsulating the entire molded strip. The encapsulant layer 104 may be formed of any suitable molding compound material including an epoxy, acrylic, silicone, or the like, for example.

Figure 2:
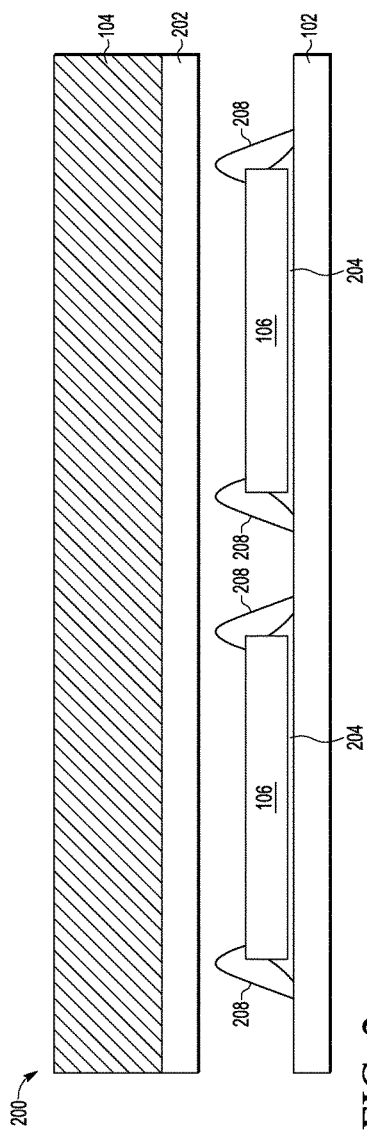
FIG. 2 shows a simplified cross sectional view of the molded strip along section line A-A of FIG. 1 during a stage of manufacture according to an embodiment of the present disclosure.

FIG. 2 shows a simplified cross sectional view of two integrated circuit devices 200 along section line A-A of molded strip 100 in FIG. 1 during a stage of manufacture according to an embodiment of the present disclosure. Integrated circuit devices 200 include a substrate 102, semiconductor dies 106, a first encapsulant layer 202, and a second encapsulant layer 104. The substrate 102 may include a leadframe, organic or ceramic substrate, chip carrier, or the like. A first major surface of substrate 102 includes die attach areas for attaching semiconductor dies 106. Each die attach area is generally surrounded with a plurality of conductive traces, wires, leads, or the like (not shown) for coupling electrical signals between locations at the outside of the integrated circuit device package and locations within the package such as wirebond sites near the die attach areas.

The semiconductor dies 106 are attached to the die attach areas of substrate 102 using any suitable die attach material 204 such as a solder alloy, an epoxy, a die-attach film, for example. The semiconductor dies 106 generally includes a plurality of bond pads located around the perimeter of the die. Semiconductor dies 106 may be formed of any semiconductive material, such as a silicon, germanium, gallium arsenide, and the like. Semiconductor dies 106 may include any or combinations of digital circuits, analog circuits, memory, processor, MEMS, sensors, and the like.

A plurality of bond wires 208 electrically couple a plurality of contact locations on the semiconductor die to contact sites on the plurality of conductive traces, wires, leads, or the like of the substrate 102. Bond wires 208 may be formed of a metal comprising aluminum, copper, silver, or gold. Bond wires 208 may be attached to the contact locations on semiconductor dies 106 and to the contact sites with either ball bonds or wedge bonds or a combination of ball bonds and wedge bonds. For example, ball bonds may be used to attach a first end of bond wires 106 to contact locations such as bond pads of the semiconductor dies 106 while wedge bonds may be used to attach the opposite ends of bond wires 106 to the contact sites of the substrate 102. In some embodiments, the semiconductor dies 106 may be attached to the substrate 102 in a flip-chip orientation wherein a plurality of ball bonds or pillars electrically couple the plurality of contact locations on the semiconductor die to contact sites on the plurality of conductive traces, wires, leads, or the like of the substrate 102.

The first encapsulant layer 202 and the second encapsulant layer 104 are placed over the matrix of integrated circuit devices including stress-sensitive areas of semiconductor dies 106, bond wires 208, and exposed portions of the first major surface of substrate 102. In this embodiment, the first encapsulant layer 202 and the second encapsulant layer 104 are conjoined before placing the first encapsulant layer 202 over semiconductor dies 106, bond wires 208, and exposed portions of the first major surface of substrate 102. In some embodiments, the first encapsulant layer 202 may be placed over the matrix of integrated circuit devices before the second encapsulant layer 104 is placed. The first encapsulant layer 202 is characterized as a low modulus molding compound having room temperature modulus of elasticity of approximately 3 GigaPascals (GPa) and lower, for example. The first encapsulant layer 202 includes a resin rich epoxy, acrylic, silicone, or the like material having a lower amount of filler material such as 0-30% silica filler, for example. The second encapsulant layer 104 is characterized as a high modulus molding compound having room temperature modulus of elasticity of approximately 15 GPa and higher, for example. The second encapsulant layer 104 includes an epoxy, acrylic, silicone, or the like material having a higher amount of filler material such as 60% or more silica filler. The first encapsulant layer 202 has a thickness of approximately 100 microns or less and the second encapsulant layer 104 has a thickness of approximately 100 microns or greater. For example, the first encapsulant layer 202 may have a thickness range of approximately 20-100 microns and may include 0-30% silica filler, and the second encapsulant layer 104 may have a thickness range of approximately 100-800 microns and may include 60-95% silica filler. Because the coefficient of thermal expansion of a low modulus molding compound may be higher than the coefficient of thermal expansion of a normal or high modulus molding compound, it may be desirable for the thickness of first encapsulant layer 202 to be less than the thickness of the second encapsulant layer 104. For example, if the first encapsulant layer 202 has a thickness of 30 microns and the second encapsulant 104 has a thickness of 700 microns, then the overall coefficient of thermal expansion of the packaged integrated circuit devices will remain very close to the coefficient of thermal expansion of a typical single layered encapsulated integrated circuit device.

Figure 3:
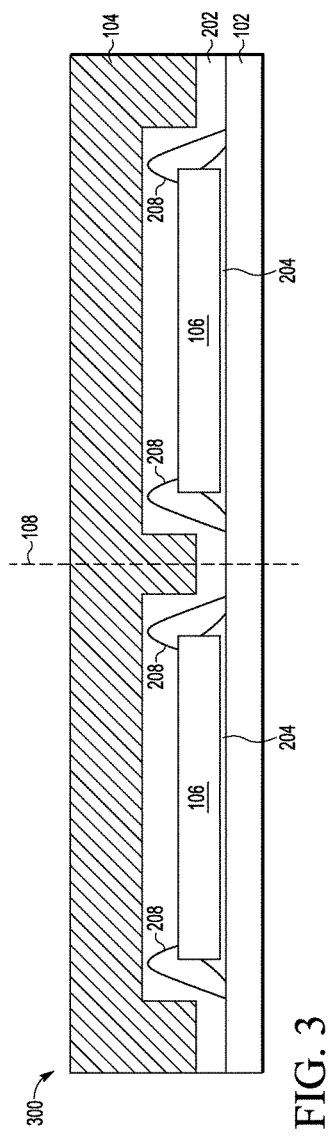
FIG. 3 shows a simplified cross sectional view of the molded strip along section line A-A of FIG. 1 during a subsequent stage of manufacture according to an embodiment of the present disclosure.

FIG. 3 shows a simplified cross sectional view of two integrated circuit devices 300 along section line A-A of molded strip 100 in FIG. 1 during a subsequent stage of manufacture according to an embodiment of the present disclosure. The first encapsulant layer 202 and the second encapsulant layer 104 are heated to respective melting points to conformally encapsulate semiconductor dies 106, bond wires 208, and exposed portions of the first major surface of substrate 102. In some embodiments, the first encapsulant layer 202 may be heated during a first thermal operation to conformally mold encapsulant over semiconductor dies 106, bond wires 208, and exposed portions of the first major surface of substrate 102 before the second encapsulant layer 104 is placed over the first encapsulant layer 202. After the first encapsulant layer 202 is molded, the second encapsulant layer 104 may be heated to form a planar encapsulated outer surface during a second thermal operation. In some embodiments, the first encapsulant layer 202 may be molded over semiconductor dies 106, bond wires 208, and exposed portions of the first major surface of substrate 102 using an encapsulating process such as injection molding for example. The second encapsulant layer 104 may similarly be molded over the first encapsulant layer 202 using an encapsulating process such as injection molding.

Figure 4:
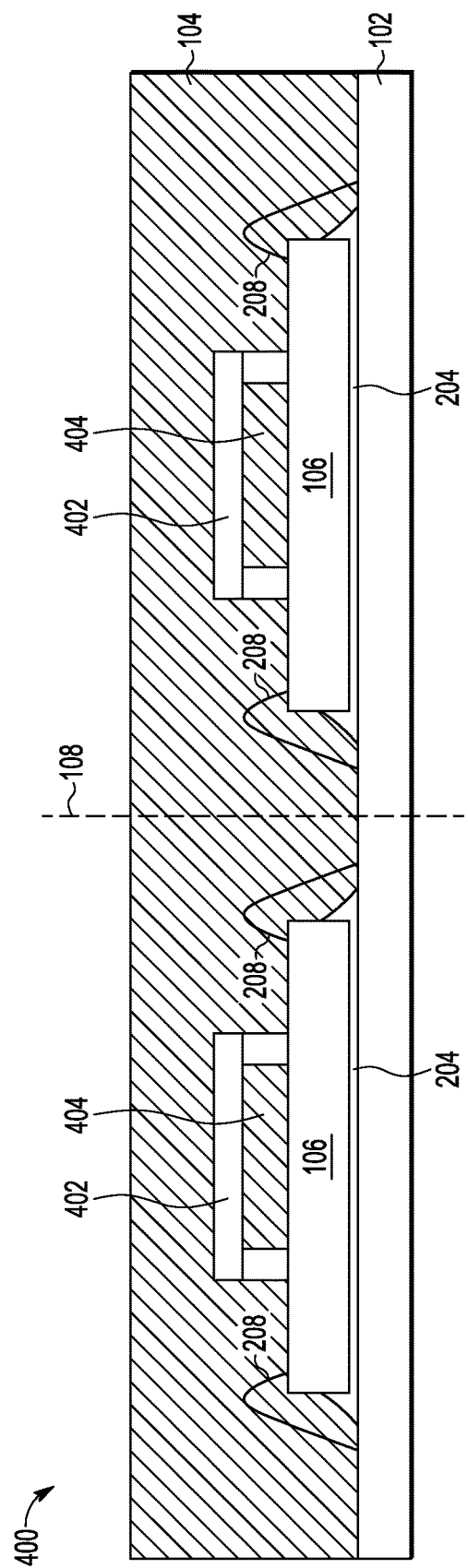
FIG. 4 shows a simplified cross sectional view of the molded strip along section line A-A of FIG. 1 during a stage of manufacture according to another embodiment of the present disclosure.

FIG. 4 shows a simplified cross sectional view of two integrated circuit devices 400 along section line A-A of molded strip 100 in FIG. 1 during a stage of manufacture according to another embodiment of the present disclosure. Integrated circuit devices 400 include a substrate 102, semiconductor dies 106, a sieve 402 positioned over stress-sensitive circuitry of each semiconductor die, and second encapsulant layer 104.

The sieve 402 is configured to form a cavity between the sieve 402 and a top surface of semiconductor die 106. The sieve 402 may be formed of any suitable material such as metal, polymer, and the like. The sieve 402 may be attached to the semiconductor die 106 with an adhesive along edges of the sieve, and openings in the sieve 402 may be sized to allow the mold compound with particles less than a specified size to pass into the cavity. The sieve 402 may be include a mesh or mesh-like material attached to the semiconductor die 106. For example, the sieve 402 may be attached to the semiconductor die 106 with an adhesive along edges of the mesh, and openings in the mesh may be sized to allow the mold compound with particles less than a specified size to pass into the cavity. The sieve 402 may be attached to the semiconductor die 106 by applying the adhesive around at least two opposing edges of the mesh before attaching the sieve 402 to the semiconductor die 106.

The substrate 102 may include a leadframe, organic or ceramic substrate, chip carrier, or the like. A first major surface of substrate 102 includes die attach areas for attaching semiconductor dies 106. Each die attach area is generally surrounded with a plurality of conductive traces, wires, leads, or the like (not shown) for coupling electrical signals between locations at the outside of the integrated circuit device package and locations within the package such as wirebond sites near the die attach areas.

The semiconductor dies 106 are attached to the die attach areas of substrate 102 using any suitable die attach material 204 such as a solder alloy, an epoxy, a die-attach film, for example. The semiconductor dies 106 generally includes a plurality of bond pads located around the perimeter of the die. Semiconductor dies 106 may be formed of any semiconductive material, such as a silicon, germanium, gallium arsenide, and the like. Semiconductor dies 106 may include any or combinations of digital circuits, analog circuits, memory, processor, MEMS, sensors, and the like.

A plurality of bond wires 208 electrically couple a plurality of contact locations on the semiconductor die to contact sites on the plurality of conductive traces, wires, leads, or the like of the substrate 102. Bond wires 208 may be formed of a metal comprising aluminum, copper, silver, or gold. Bond wires 208 may be attached to the contact locations on the semiconductor dies 106 and to the contact sites with either ball bonds or wedge bonds or a combination of ball bonds and wedge bonds. For example, ball bonds may be used to attach a first end of bond wires 106 to contact locations such as bond pads of the semiconductor dies 106 while wedge bonds may be used to attach the opposite ends of bond wires 106 to the contact sites of the substrate 102.

The second encapsulant layer 104 is deposited over the matrix of integrated circuit devices including positioned sieves 402, semiconductor dies 106, bond wires 208, and exposed portions of the first major surface of substrate 102. In this embodiment, the second encapsulant includes less than 30% of filler particles smaller than a specified size so that the cavity is filled with the encapsulant without the filler particles larger than the specified size. For example, if the second encapsulant 104 includes less than 30% of filler particles smaller than a specified filler particle diameter of 1 micron, then a sieve configured to filter particles including a diameter of 1 micron or larger will allow first encapsulant 404 material with a 30% amount of filler to penetrate through the sieve. When the second encapsulant layer 104 is deposited over sieves 402, semiconductor dies 106, bond wires 208, and exposed portions of the first major surface of substrate 102, filtered encapsulant penetrates through the sieve 402 filling the cavity formed under the sieve 402 with the first encapsulant 404 layer of material. The first encapsulant layer 404 is characterized as a low modulus molding compound having room temperature modulus of elasticity of approximately 3 GigaPascal (GPa) and lower, for example. The second encapsulant layer 104 includes epoxy, acrylic, silicone, or the like. The second encapsulant layer 104 may be characterized as a high modulus molding compound having room temperature modulus of elasticity of approximately 15 GPa and higher, for example. In some embodiments, the second encapsulant layer 104 includes a higher amount of filler material such as 60% or more silica filler with 30% of the filler particles smaller than a specified size, for example.

In this embodiment, the cavity of the sieve 402 has a thickness of approximately 100 microns or less and the second encapsulant layer 104 has a thickness of approximately 100 microns or greater. For example, the cavity of the sieve 402 may have a thickness range of approximately 20-100 microns, and the second encapsulant layer 104 may have a thickness range of approximately 100-800 microns. Because the coefficient of thermal expansion of the low modulus first encapsulant layer 404 may be higher than the coefficient of thermal expansion of the second encapsulant layer 104, it may be desirable for the thickness of first encapsulant layer 404 to be less than the thickness of the second encapsulant layer 104. For example, if the first encapsulant layer 404 has a thickness of 30 microns and the second encapsulant 104 has a thickness of 700 microns, then the overall coefficient of thermal expansion of the packaged integrated circuit devices will remain very close the coefficient of thermal expansion of a typical single layered encapsulated integrated circuit device having a thickness of 700 microns.

Generally, there is provided, a method for making a plurality of packaged integrated circuit devices including: placing a first layer of material with a modulus of elasticity greater than 0.1 and less than 3 GigaPascals (GPa) directly over a matrix of integrated circuit components and exposed portions of a first major surface of a substrate on which the integrated circuit components are mounted; placing a second layer of material with a modulus of elasticity greater than 15 and less than 50 GPa over the first layer of material to encapsulate the integrated circuit components; and singulating the substrate to form the plurality of packaged integrated circuit devices. The method may further include heating the first layer of material to a melting point temperature of the first layer of material, and heating the second layer of material to a melting point temperature of the second layer of material until the second layer of material has melted. The method may further include molding the first layer of material around the integrated circuit components and the exposed portions of the first major surface of the substrate before the second layer of material is placed over the first layer of material. The method may further include molding the second layer of material over the first layer of material after the first layer of material is molded. The method may further include heating the first and second layers of material to encapsulate the integrated circuit components and the exposed portions of the first major surface of the substrate. The first layer of material may include one of a group consisting of epoxy, acrylic, and silicone, with zero to thirty percent filler material. The second layer of material may include one of a group consisting of epoxy, acrylic and silicone, with sixty to ninety-five percent filler material. The substrate may be one of a group consisting of a lead frame, a chip carrier, an organic substrate, and a ceramic substrate. A thickness of the first layer may be between 20 and 100 microns and a thickness of the second layer may be between 100 and 800 microns. The first layer and the second layer may be conjoined before the first layer is placed over the matrix of integrated circuit components.

In another embodiment, there is provided, a method for making a packaged integrated circuit device including: attaching an integrated circuit component to a first major surface of a substrate; positioning a sieve over stress-sensitive circuitry of the integrated circuit component, wherein the sieve is configured to form a cavity between the sieve and a top surface of the integrated circuit component; and depositing a mold compound over the sieve, the integrated circuit component and exposed portions of the first major surface of the substrate, wherein the mold compound includes less than thirty percent of filler particles smaller than a specified size so that the cavity is filled with the mold compound without the filler particles larger than the specified size. The mold compound may further include one of a group consisting of epoxy, acrylic, and silicone. The substrate is one of a group consisting of a lead frame, a chip carrier, an organic substrate, and a ceramic substrate. A thickness of the cavity may be between 20 and 100 microns and a thickness of the mold compound may be between 100 and 800 microns. The method may further include attaching the sieve to the integrated circuit component, wherein the sieve includes a mesh attached to the integrated circuit component with an adhesive along edges of the mesh, and openings in the mesh are sized to allow the mold compound with particles less than the specified size to pass into the cavity. The mesh may be made of polymer, metal, or ceramic. The method may further include applying the adhesive around at least two opposing edges of the mesh before attaching the sieve to the integrated circuit component.

In yet another embodiment, there is provided, a method of fabricating a plurality of semiconductor devices including: attaching a plurality of integrated circuit (IC) die to a substrate, wherein the attaching includes forming electric connections between contacts on the IC die and contacts on the substrate; after the IC die is attached to the substrate, placing a first encapsulating material over stress-sensitive areas of the IC die, wherein the first encapsulating material includes less than thirty percent of filler particles greater than a specified size; and placing a second encapsulating material over the first encapsulating material, wherein the second encapsulating material includes sixty to ninety-five percent of filler particles. The method may further include forming the first encapsulating material by filtering the second encapsulating material through a sieve attached over stress-sensitive areas of the IC die. The first encapsulating material may be a blanket layer of material that is melted or molded over the IC die and exposed portions of the substrate around the IC die, and the second encapsulating material may be a blanket layer of material that is melted or molded over the first encapsulating material.

By now it should be appreciated that there has been provided a lower cost packaging method for integrated circuit devices which reduces stress on the surface of a semiconductor die. In one embodiment, the integrated circuit device packaging includes a first layer of encapsulant which buffers stress from a second layer of encapsulant. The first layer of encapsulant includes a low modulus material and is placed over the semiconductor die. The second layer of encapsulant includes a high modulus material and is placed over the first layer. Both the first layer and the second layer encapsulants can be placed simultaneously during the same manufacturing step thus minimizing manufacturing steps and reducing cost.

The semiconductor die described herein can be formed from any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making a plurality of packaged integrated circuit devices comprising:
    placing a first layer of material with a modulus of elasticity greater than 0.1 and less than 3 GigaPascals (GPa) directly over a matrix of integrated circuit components and exposed portions of a first major surface of a substrate on which the integrated circuit components are mounted;
    placing a second layer of material with a modulus of elasticity greater than 15 and less than 50 GPa over the first layer of material to encapsulate the integrated circuit components, the first layer and the second layer are conjoined before the first layer is placed over the matrix of integrated circuit components; and
    singulating the substrate to form the plurality of packaged integrated circuit devices.

2. The method of claim 1 further comprising:
    heating the first layer of material to a melting point temperature of the first layer of material; and
    heating the second layer of material to a melting point temperature of the second layer of material until the second layer of material has melted.

3. The method of claim 1 further comprising:
    molding the first layer of material and the second layer of material around the integrated circuit components and the exposed portions of the first major surface of the substrate.

4. The method of claim 2 further comprising:
    heating the first and second layers of material to encapsulate the integrated circuit components and the exposed portions of the first major surface of the substrate.

5. The method of claim 1 wherein:
    the first layer of material includes one of a group consisting of epoxy, acrylic, and silicone, with zero to thirty percent filler material.

6. The method of claim 1 wherein:
    the second layer of material includes one of a group consisting of epoxy, acrylic and silicone, with sixty to ninety-five percent filler material.

7. The method of claim 1 wherein:
    the substrate is one of a group consisting of a lead frame, a chip carrier, an organic substrate, and a ceramic substrate.

8. The method of claim 1 wherein:
    a thickness of the first layer is between 20 and 100 microns and a thickness of the second layer is between 100 and 800 microns.

9. A method for making a packaged integrated circuit device comprising:
    attaching an integrated circuit component to a first major surface of a substrate;

positioning a sieve over stress-sensitive circuitry of the integrated circuit component, wherein the sieve is configured to form a cavity between the sieve and a top surface of the integrated circuit component;

attaching the sieve to the integrated circuit component, wherein the sieve includes a mesh attached to the integrated circuit component with an adhesive along edges of the mesh, and openings in the mesh are sized to allow a mold compound with particles less than a specified size to pass into the cavity; and depositing the mold compound over the sieve, the integrated circuit component and exposed portions of the first major surface of the substrate, wherein the mold compound includes less than thirty percent of filler particles smaller than the specified size so that the cavity is filled with the mold compound without the filler particles larger than the specified size.

10. The method of claim 9 wherein:
the mold compound further includes one of a group consisting of epoxy, acrylic, and silicone.

11. The method of claim 9 wherein:
the substrate is one of a group consisting of a lead frame, a chip carrier, an organic substrate, and a ceramic substrate.

12. The method of claim 9 wherein:
a thickness of the cavity is between 20 and 100 microns and a thickness of the mold compound is between 100 and 800 microns.

13. The method of claim 9 wherein the mesh is made of polymer, metal, or ceramic.

14. The method of claim 9 further comprising applying the adhesive around at least two opposing edges of the mesh before attaching the sieve to the integrated circuit component.

15. A method of fabricating a plurality of semiconductor devices comprising:

attaching a plurality of integrated circuit (IC) die to a substrate, wherein the attaching includes forming electric connections between contacts on the IC die and contacts on the substrate;

after the IC die is attached to the substrate, attaching a sieve over stress-sensitive areas of the IC die, wherein the sieve is configured to form a cavity between the sieve and a top surface of the IC die and includes openings sized to allow an encapsulating material with particles less than a specified size to pass into the cavity; and depositing the encapsulating material over the sieve and exposed portions of the substrate, wherein the encapsulating material includes sixty to ninety-five percent of filler particles so that the cavity is filled with the encapsulating material without the filler particles larger than the specified size.

16. The method of claim 15 wherein:
the encapsulating material is a blanket layer of material that is melted or molded over the IC die and exposed portions of the substrate around the IC die.

17. The method of claim 15 wherein:
the encapsulating material further includes one of a group consisting of epoxy, acrylic, and silicone.

18. The method of claim 15 wherein:
the substrate is one of a group consisting of a lead frame, a chip carrier, an organic substrate, and a ceramic substrate.

19. The method of claim 15 wherein:
a thickness of the cavity is between 20 and 100 microns and a thickness of the encapsulating material is between 100 and 800 microns.

20. The method of claim 15 wherein:
the encapsulating material includes less than thirty percent of filler particles smaller than the specified size.

* * * * *